United States Patent
Singh et al.

(10) Patent No.: US 7,714,931 B2
(45) Date of Patent: May 11, 2010

(54) SYSTEM AND METHOD FOR MOUNTING AN IMAGE CAPTURE DEVICE ON A FLEXIBLE SUBSTRATE

(75) Inventors: Harpuneet Singh, Dublin, CA (US); Nicholas E. Brathwaite, Hayward, CA (US); Bhret R. Graydon, San Jose, CA (US)

(73) Assignee: Flextronics International USA, Inc., San Jose, CA (US)

( * ) Notice: Subject to any disclaimer, the term of this patent is extended or adjusted under 35 U.S.C. 154(b) by 1125 days.

(21) Appl. No.: 10/877,816

(22) Filed: Jun. 25, 2004

(65) Prior Publication Data

US 2005/0285973 A1 Dec. 29, 2005

(51) Int. Cl.
*H04N 5/225* (2006.01)
(52) U.S. Cl. ..................................... 348/374
(58) Field of Classification Search ................. 348/374, 348/373, 335, 340, 76; 439/67, 68, 69, 70, 439/71, 72, 77
See application file for complete search history.

(56) References Cited

U.S. PATENT DOCUMENTS

| | | | | |
|---|---|---|---|---|
| 4,831,456 A | * | 5/1989 | Takamura | 348/374 |
| 5,616,050 A | * | 4/1997 | Suski | 439/495 |
| 5,973,932 A | * | 10/1999 | Nguyen | 361/779 |
| 6,384,397 B1 | | 5/2002 | Takiar et al. | 250/208.1 |
| 6,603,107 B2 | | 8/2003 | Miyake | 250/208.1 |
| 6,621,616 B1 | * | 9/2003 | Bauer et al. | 359/273 |
| 6,654,064 B2 | * | 11/2003 | Ishikawa | 348/374 |
| 7,009,654 B2 | * | 3/2006 | Kuno et al. | 348/374 |
| 7,046,296 B2 | * | 5/2006 | Shinomiya | 348/374 |
| 2001/0010562 A1 | * | 8/2001 | Nakagishi et al. | 348/374 |
| 2002/0057468 A1 | | 5/2002 | Segawa et al. | |
| 2002/0171031 A1 | | 11/2002 | Kim et al. | 250/208.1 |
| 2003/0016300 A1 | * | 1/2003 | Ting | 348/335 |
| 2003/0218251 A1 | | 11/2003 | Seo | 257/737 |
| 2004/0027477 A1 | * | 2/2004 | Tamura et al. | 348/340 |
| 2004/0041938 A1 | * | 3/2004 | Seo et al. | 348/340 |
| 2004/0065962 A1 | | 4/2004 | Shinomiya | |
| 2004/0094825 A1 | | 5/2004 | Onishi et al. | 257/666 |
| 2004/0132491 A1 | | 7/2004 | Kim et al. | 455/556.1 |

FOREIGN PATENT DOCUMENTS

EP 1156705 11/2001

OTHER PUBLICATIONS

EP Application No. 05761050.Mar. 2218, European Search Report dated Nov. 20, 2009.

* cited by examiner

*Primary Examiner*—Jason Chan
*Assistant Examiner*—Nicholas G Giles
(74) *Attorney, Agent, or Firm*—Henneman & Associates, PLC; Larry E. Henneman, Jr.

(57) ABSTRACT

A digital camera module includes an image capture device mounted on a flexible circuit substrate. In one embodiment of the digital camera module, the image capture device is mounted directly (e.g., by an adhesive) on the flexible circuit substrate. A stiffener (e.g., a piece of circuit board material) is mounted to the back of the flexible circuit substrate to support wire bonding of the image capture device onto the flexible circuit substrate and/or to support the mounting of additional components (e.g., a lens housing).

51 Claims, 7 Drawing Sheets

FIG. 1

Prior Art

SYSTEM AND METHOD FOR MOUNTING AN IMAGE CAPTURE DEVICE ON A FLEXIBLE SUBSTRATE

BACKGROUND OF THE INVENTION

1. Field of the Invention

This invention relates generally to electronic devices, and more particularly to a device for mounting an image sensor. Even more particularly, the invention relates to a device for mounting an image sensor on a flexible substrate such as a flexible printed circuit (FPC).

2. Description of the Background Art

Unlike traditional cameras that use film to capture and store an image, digital cameras use various solid-state devices collectively referred to as image capture devices. These small silicon chips contain millions of photosensitive diodes called photosites. When the shutter (mechanical or electrical) is open, each photosite records the intensity or brightness of the incident light by accumulating a charge; the more light, the higher the charge. The brightness recorded by each photosite is then stored as a value indicative of the brightness and/or color for a corresponding pixel of the captured image. The brightness/color values can then be used to set the colors and brightness of dots on a display screen or ink on a printed page to reconstruct the image.

Image capture devices are mounted within digital cameras so as to be aligned with a lens and an opening in the camera body. The silicon chip (die) itself is typically mounted onto a ceramic leadless chip carrier (CLCC), which in turn is mounted on a printed circuit board (PCB). The CLCC is made of a ceramic material which can withstand high temperatures to withstand the soldering of electrical connections. It does not have leads but has one set of contact pads around it's perimeter for making electrical connections to the PCB via a reflow solder process and another set of contact pads or lead frame for making electrical connections (e.g., via wire bonding) with the die. During the mounting process, the contact pads of the CLCC are connected (e.g., via soldering) to electrical plated pads of the PCB. A lens is then mounted to the PCB over the die and CLCC. Finally, the PCB is mounted in a fixed position within the camera, so that the lens aligns with an opening in the camera.

The devices and assembly methods of the prior art have several disadvantages in both the manufacturing process and the quality of the device. Alignment of the image capture device with the opening in the camera can be difficult, particularly in small cameras (e.g., cameras in mobile telephones). Because multiple devices are mounted on the PCB, the tolerances accumulate to reduce the precision with which the image capture device can be aligned with the opening. Additionally, PCBs typically include other components (e.g., keypad, etc.) that must be aligned with other openings, further complicating the alignment problem.

Figure 1:
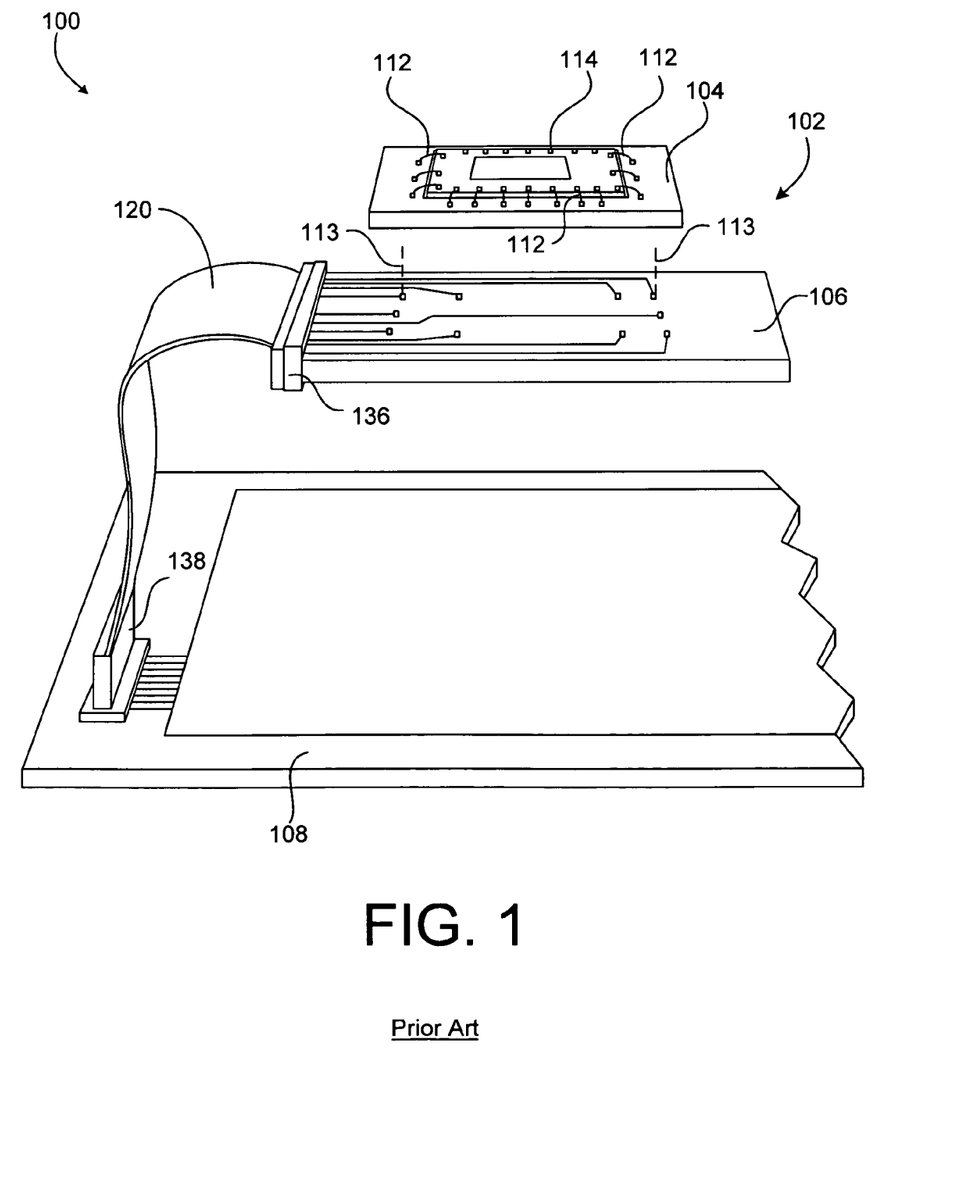
FIG. 1 is a perspective view of a prior art camera module with a flexible connector.

FIG. 1 illustrates one example of a prior art solution to the above-described alignment problem. In this particular embodiment, a camera device 100 includes an independent camera module 102, which is flexibly coupled to a main PCB 108. Independent camera module 102 includes a PCB 106 that supports a CLCC 104, which in turn supports a die 114. PCB 106 is connected to a main PCB 108 via a flexible electrical circuit 120 that transfers data/power between the independent camera module PCB 102 and main PCB 108. The FPC 120 decouples the physical alignment of independent camera module 102 and main PCB 108.

Although the device of FIG. 1 helps alleviate the alignment problem, it creates other disadvantages. For example, camera module 100 requires more components than the previously described embodiment, such as FPC 120 and an additional PCB 106. Further, the additional components require additional assembly steps. The cost of the additional components and the additional assembly steps increase the overall cost of the product.

Note also that camera module 100 includes an increased number of electrical connections and, therefore, has an increased number of points of possible failure. In particular, camera module 100 includes at least four sets of electrical connections. A first set of electrical connections 112 exist between die 114 and CLCC 104. A second set of electrical connections 113 exist between CLCC 104 and PCB 106. A third set of electrical connections (inside connector 136) exist between PCB 106 and FPC 120. Finally, a fourth set of electrical connections (inside connector 138) exist between FPC 120 and main PCB 108. The increased number of electrical connections, and thus the increased number of points of possible failure, decreases the overall reliability of the product.

What is needed, therefore, is a device that helps alleviate the alignment problem, yet requires fewer components than prior art solutions. What is also needed is a device that helps alleviate the alignment problem, yet includes fewer electrical connections (e.g., solder points, etc.), and thus fewer points of possible failure, as compared to the prior art solutions. What is also needed is a device that requires fewer manufacturing steps and/or a shorter assembly time as compared to the prior art.

SUMMARY

The present invention overcomes the problems associated with the prior art by providing a digital camera module that includes an image capture device mounted on an FPC substrate. Mounting the image capture device on the FPC substrate greatly reduces optical alignment related tolerances and the number of electrical connections, as compared to devices of the prior art. The invention further facilitates the fast and efficient assembly of digital camera modules that can be easily aligned with other features of a digital camera.

In one embodiment of the digital camera module, the image capture device is mounted directly (e.g., by an adhesive) on the FPC substrate. A stiffener (e.g., a piece of circuit board material) is mounted to the back of the FPC substrate to support wire bonding of the image capture device onto the FPC substrate and/or to support the mounting of additional components (e.g., a lens housing).

In a particular embodiment, the FPC substrate includes conductive trace layers formed on one or both surfaces of a flexible base layer. In a more particular embodiment, the flexible base layer is composed of a synthetic polymeric resin (e.g., polyimide) that is heat resistant. Contact pads are formed over the conductive trace layer to facilitate electrical connections thereto. These contact pads include, for example, a layer of nickel formed over the conductive traces and a layer of gold formed over the layer of nickel. Optionally, an electrically insulating surface layer (e.g., soldermask) is formed over the trace layer, and defines openings on the FPC substrate so that connections can be made with the contact (e.g., wire bond) pads.

In the particular embodiment shown, the image capture device is a bare integrated circuit chip die that includes an image capture surface and contact (die bond) pads (e.g., a layer of nickel and a layer of gold) formed thereon. The die bond pads facilitate a direct electrical connection with the contact pads of the FPC substrate. For example, the die bond pads of the image capture device are electrically connected to the wire bond pads of the FPC substrate via gold ball wire bonding.

Optionally, the digital camera module further includes a lens housing mounted over the image capture device. In the particular embodiment shown, the lens housing is mounted over the FPC substrate and to the stiffener provided on the opposite side of the FPC substrate. The rear stiffener is composed, for example, of a glass filled epoxy resin material. The lens housing includes at least one mounting post disposed through at least one aperture in the FPC substrate and at least one corresponding aperture in the stiffener.

An optional connector is formed on the FPC substrate to facilitate electrical connection of the camera module to another circuit board or component. In a particular embodiment, the connector includes a plurality of connector pads (e.g., a layer of nickel and a layer of gold) formed over the conductive traces of the FPC substrate. In an even more particular embodiment, the connector pads are formed on one side of the FPC substrate, and a stiffener is mounted to an opposite side of the FPC substrate to facilitate a ZIF style FPC connector.

A method for manufacturing a digital camera module is also described. The method includes the steps of providing an FPC substrate, providing an image capture device, and mounting the image capture device on the FPC substrate.

In a particular method, the step of providing an FPC substrate includes forming one or more conductive trace layers on a flexible base layer of the FPC substrate. In a more particular method, electrical contact pads are formed over the trace layer(s). Optionally, the contact pads are formed by forming a layer of nickel over the conductive traces and forming a layer of gold over the layer of nickel. The metal layers are then patterned into the electrical contacts. Optionally, the step of providing the FPC substrate includes forming an electrically insulating layer over the conductive trace layer (s).

In another particular method, the step of providing the image capture device includes forming electrical contact pads (e.g., nickel-gold) on an integrated circuit chip, and the step of mounting the image capture device on said FPC substrate includes directly connecting the contact pads of the image capture device to the contact pads of FPC substrate. In a more particular method, contact pads of the image capture device are electrically connected to contact pads of the FPC substrate via gold stud thermal compression bonding with adhesive.

The step of mounting the image capture device on the flexible substrate further includes mounting a stiffener (e.g., by an adhesive) to the FPC substrate under the image capture device. In a particular method, the stiffener is mounted on an opposite side of the FPC as the image capture device and/or is positioned at least partially under the contact pads of the FPC substrate to support wire bonding to the contact pads of the FPC substrate.

Optionally, the method further includes mounting a lens housing to the FPC over the image capture device. In a particular method, the step of mounting the lens housing includes attaching the lens housing to the stiffener. An even more particular method includes inserting a plurality of mounting posts formed on one of the lens housing and the stiffener through a complementary plurality of apertures formed in the other of the lens housing and the stiffener.

The method further includes an optional step of forming a connector on the FPC substrate. In a particular method, the step of forming the connector includes forming connector pads (e.g., Ni—Au pads) over the conductive trace layers of the FPC substrate. In a more particular method, the step of forming the connector includes forming the electrical contacts on a surface of the FPC substrate and applying a stiffener to a second surface of the FPC substrate opposite said electrical contacts.

BRIEF DESCRIPTION OF THE DRAWINGS

The present invention is described with reference to the following drawings, wherein like reference numbers denote substantially similar elements.

DETAILED DESCRIPTION

The present invention overcomes the problems associated with the prior art, by providing a system and method for mounting an image capture device on an FPC substrate. In the following description, numerous specific details are set forth (e.g., particular construction materials, FPC substrate structure, etc.) in order to provide a thorough understanding of the invention. Those skilled in the art will recognize, however, that the invention may be practiced apart from these specific details. In other instances, details of well known electronic manufacturing practices (e.g., material selection, assembly, focusing operations, etc.) and components have been omitted, so as not to unnecessarily obscure the present invention.

Figure 2:
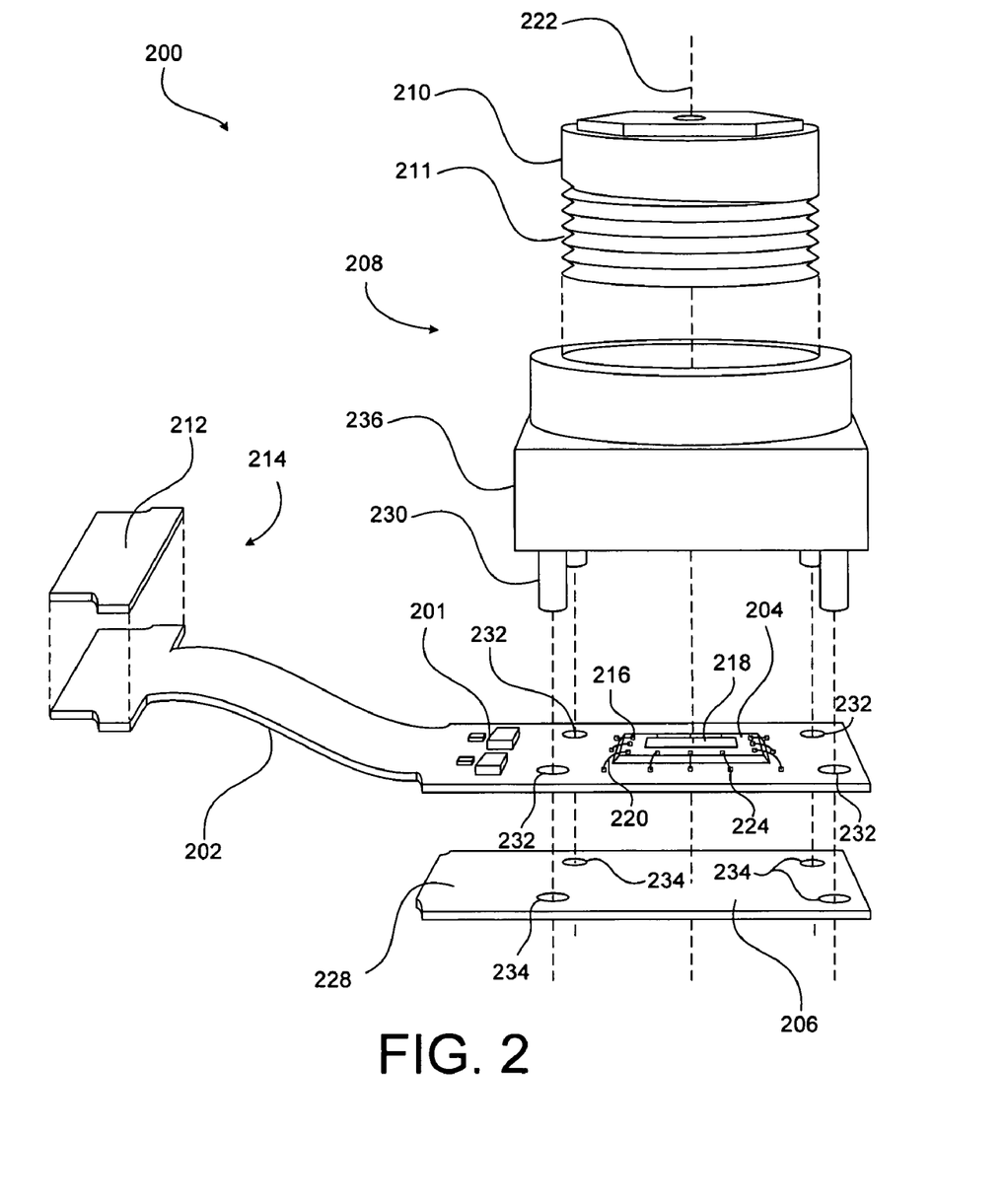
FIG. 2 is an exploded view of a camera module according to one embodiment of the present invention.

FIG. 2 is an exploded view of a digital camera module 200, which includes an image capture device 204, mounted directly to an FPC substrate 202. Digital camera module 200 further includes a lens housing 208 mounted to FPC substrate 202, and a connector 214 formed on an opposite end of FPC substrate 202.

In this particular embodiment, image capture device 204 is a bare die (e.g., an integrated circuit chip) that includes an image capture surface (sensor array) 218, data processing circuitry (not shown), and a plurality of die bond pads 216. Sensor array 218 converts images focused thereon into electrical signals, which are processed by the processing circuitry. Die bond pads 216 provide for electrical connections that enable the processing circuitry to exchange data and instructions (e.g., data representative of captured images, instructions to record an image, etc.) with electronic circuits external to device 204. For example, in this particular embodiment, die bond pads 216 are wire bonded 220 to electrical wire bond pads 224 of FPC substrate 202, which are electrically coupled with connector contacts 250 (FIG. 5) of connector 214, via conductive traces (not visible in FIG. 2) within FPC substrate.

Image capture device 204 is physically mounted directly on FPC substrate 202 via a nonconductive adhesive. Image capture device 204 is placed on FPC substrate 202 using high precision, automated die attaching equipment, using fiducial markings on the flexible substrate as a guide, such that the optical center of image capture surface 218 is positioned on optical axis 222. Those skilled in the art will be familiar with such chip placement equipment. Further, using epoxy to mount image capture device 204, the planarity of image capture device 204 with respect to FPC substrate 202 can be maintained within + or – one degree, such that image capture surface 218 is substantially perpendicular to optical axis 222. The variation in epoxy thickness is compensated for via lens adjustment, as will be described below in greater detail.

Passive components 201 are representative of additional electronic components, which can be incorporated into the electronic circuit as required by image capture device 204 and connected via conductive traces of FPC substrate 202. In the embodiment described herein, passive components 201 are devices such as capacitors, resistors, inductors, etc., which are mounted on contact pads (not visible) to form electrical connections with the conductive traces of FPC substrate 202. However, it should be understood that electronic devices other than passive components can be mounted on and/or incorporated into the electronic circuit of FPC substrate 202.

A stiffener 206 is attached (e.g., via thermoset acrylic adhesive) to the rear surface of FPC substrate 202 to provide physical support for subsequent assembly operations (e.g., wire bonding of electrical connections, die attach, mounting of additional mechanical or electrical devices, etc.). The inventors have found that forming stiffener 206 from a glass filled epoxy resin material provides sufficient thermal insulation and rigidity. Optionally, stiffener 206 can be formed of other materials, including without limitation polyimide, FR4, and metal. In this particular embodiment, stiffener 206 includes an extended portion 228 to back FPC substrate 202 significantly beyond image capture device 204, to provide an area for passive components 201 to be physically and electrically connected to FPC substrate 202 outside of the contact area of lens housing 208.

Lens housing 208 includes a lens module 210 and a base 236. Those skilled in the art will recognize that lens module 210 will include one or more lenses and other components (e.g., infrared filters, etc.), which are required to focus a clear optical image on sensor array 218. The particular optical components of lens module 210 will vary according to application, and is not particularly relevant to the present invention. Note that lens module 210 includes a set of male threads 211, that mate with a complementary set of female threads (not shown) inside base 236, such that lens module 210 can be screwed into and out of lens housing base 236. Rotating lens module 210 within base 236 will thus cause lens module 210 to move toward or away from sensor array 218, depending on the direction of rotation, thereby facilitating the focusing of an image on sensor array 218.

Lens housing base 236 is aligned with and mounted to FPC substrate 202 via four mounting posts 230. FPC substrate 202 and rear stiffener 206 each include a plurality of apertures 232 and 234, respectively. Apertures 232 align with apertures 234 to receive mounting posts 230 there through. Rear stiffener 206 is then fixed to mounting posts 230 of lens housing 208 by, for example, a thermal weld or an adhesive. Note that apertures 232 are positioned such that lens housing 208 is mounted on FPC substrate 202 directly over image capture device 204 and lens module 210 is centered with respect to optical axis 222.

Connector 214 is formed at the end of FPC substrate 202 to provide an electrical connection from camera module 200 to a PCB fixed within a device (e.g., a cellular phone, camera body, etc). Connector 214 includes a plurality of connector contacts (not visible in FIG. 2) on the under side of flexible substrate 202 and a stiffener 212 applied to the upper side of flexible substrate 202. Stiffener 212 is formed of a rigid, electrically insulating material, and can be formed, for example, from the same material as stiffener 206. Together, stiffener 212 and the connector contacts on the terminal end of FPC substrate 202 form a male electrical connector 214 that can be plugged into a corresponding female electrical connector on a host board.

Note that camera module 200 requires fewer parts to mount image capture device 204, than does camera module 100 of FIG. 1. In particular, because the conductive circuit traces are formed in FPC substrate 202, PCB 106 and connector 136 are not required. Further, because image capture device 204 is mounted directly on FPC substrate 202, CLCC 104 is not required. Thus, camera module 200 eliminates elements of the prior art device, while retaining the functionality of those elements.

As indicated above, prior art camera module 100 requires at least four connections in series to connect die 114 to main PCB 108. Note that the wirebond connection between die 114 and CLCC 104 is counted as a single connection, even though there are two bond points in the connection. In contrast, camera module 200 requires only two series connections to connect image capture device 204 with another PCB. The first connection is the wire bond connection between die bond pads 216 of image capture device 204 and wire bond pads 224 of FPC substrate 202. The second connection is between the connector contact pads of connector 214 and the female connector of the host PCB. Thus, at least two connections are eliminated for each die bond pad 216. Assuming that a typical image capture device has around 44 die bond pads, then 88 electrical connections are eliminated from the circuit.

Figure 3:
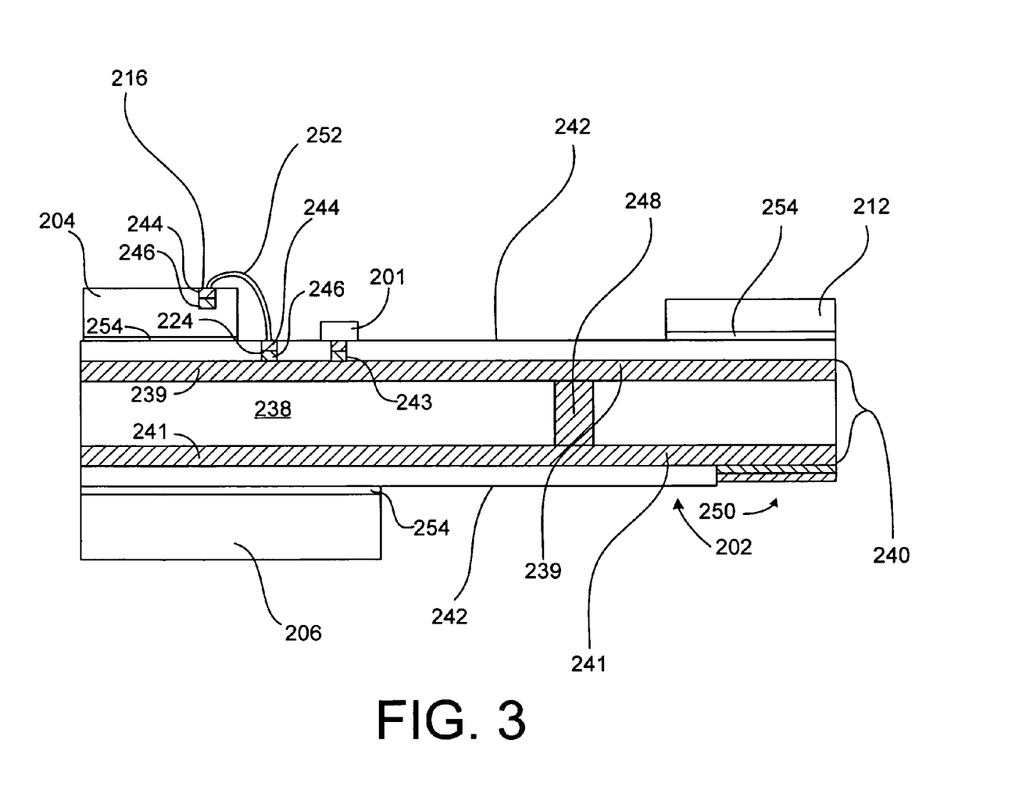
FIG. 3 is a cross-sectional view of an image capture device mounted on an FPC substrate according to one embodiment of the present invention.

FIG. 3 is a cross sectional view of FPC substrate 202 with image capture device 204, stiffener 206, and stiffener 212 mounted thereon. Note that the drawing of FIG. 3 is not to scale. For example, the thickness of FPC substrate 202 is greatly exaggerated to show the detailed structure thereof.

FPC substrate 202 includes a flexible base layer 238 composed of, for example, polyimide. Flexible substrate 202 further includes electrically conductive traces 240 patterned in an upper metal layer 239 and a lower metal layer 241 both formed, for example, of copper. Conductive traces 240 provide conductive pathways between wire bond pads 224, passive component pads 243, and connector contact pads 250. A plurality of vias 248 (only one shown) formed through flexible base layer 238 provide electrical connections between traces 240 formed in upper metal layer 239 and traces 240 formed in lower metal layer 241.

It is unlikely that a cross-section through FPC substrate 202 would show metal layers 239 and 241 being uninterrupted along the entire length of FPC substrate 202, as shown in FIG. 3. Rather, the actual cross-sectional view would depend on the particular routing of traces 240 formed in metal layers 239 and 241 (by photolithography or some other suitable means), as dictated by the particular circuit design. The design of such circuits is well within the capabilities of one of ordinary skill in the electronic design art.

FPC substrate 202 further includes upper and lower insulating layers 242 formed, for example, of solder mask. Insulating layers 242 define openings that expose wire bond pads 224, passive component pads 243, and connector contact pads 250. Contact pads 224, 243 and 250 include a nickel layer 246 formed on conductive traces 240 and a gold layer 244 formed on nickel layer 246. Gold layer 244 provides a suitable surface for wire bonding connections to bond pads 216 and 224. For example, die bond pads 216 and wire bond pads 224 are electrically connected via a gold wire bond 252. Further, gold layer 244 resists corrosion of contact pads 216, 224, 243 and connector pads 250. Nickel layer 246, disposed between gold layer 244 and traces 240, prevents gold layer 244 from coming in direct contact with copper traces 240 and also provides suitable adhesion to both gold layer 244 and traces 240.

As shown in FIG. 3, stiffener 206 is mounted to FPC substrate 202, with an adhesive 254, under image capture device 204 on an opposite side of FPC substrate 202. Stiffener 206 provides rigidity for FPC substrate 202 to facilitate subsequent assembly steps such as attachment of image capture device 204, wire bonding, die attach, mounting passive components 201, and mounting lens housing base 236. Note that stiffener 206 extends beyond the geometric boundary of image capture device 204.

Stiffener 212 is mounted, with adhesive 254, on the top side of FPC substrate 202 over connector contacts 250, to form connector 214. Stiffener 212 is a rigid, electrically insulating material (e.g., FR4 or polyimide). The rigidity of stiffener 212 provides support so that connector 214 can be firmly plugged into a mating connector.

Figure 4:
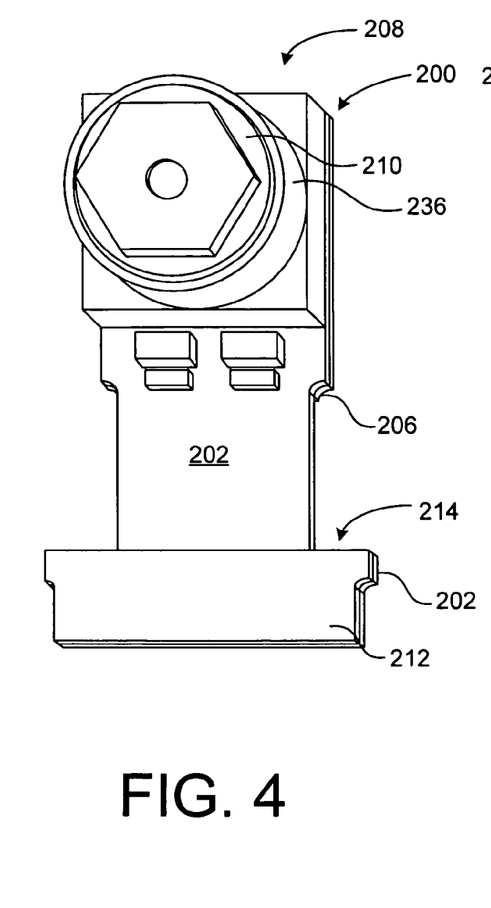
FIG. 4 is a front perspective view of a camera module shown in FIG. 2.

FIG. 4 is a front perspective view of assembled camera module 200 in an upright position and shows lens housing 208 mounted on one end of FPC substrate 202 and connector 214 mounted on the other end. Note that lens module 210 is screwed most of the way into housing base 236. Once lens module is focused (by rotating within base 236) with respect to image capture device 204 (not visible in this view), lens module 210 is fixed in position with respect to base 236 with a bond formed there between, for example by an adhesive, a laser weld, or any other suitable means.

Figure 5:
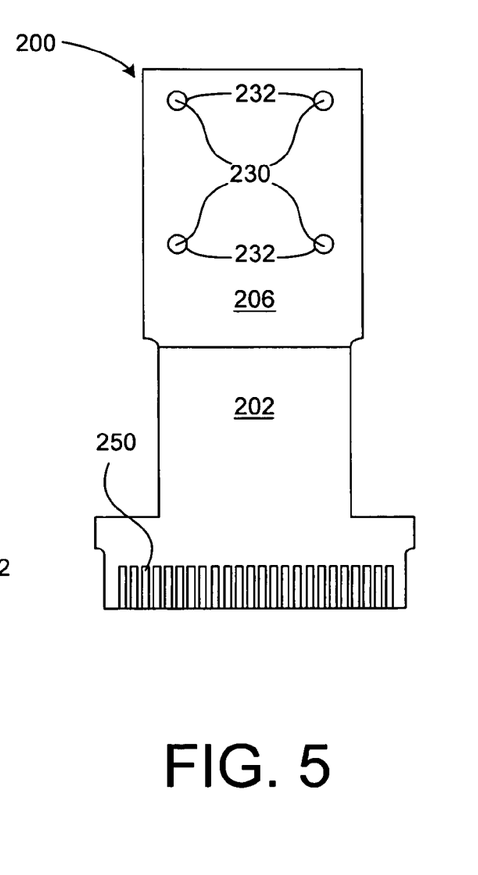
FIG. 5 is a rear view of the camera module shown in FIG. 2.

FIG. 5 is a rear plan view of camera module 200 showing connector contact pads 250, which are formed on the rear surface (bottom surface in FIG. 3) of FPC substrate 202. Connector contact pads 250 are formed in generally the same way and at the same time as passive component pads 243 and wire bond pads 224. Thus, connector pads 250 also include a nickel layer 246 formed over conductive traces 240 and a gold layer 244 formed over nickel layer 246. Nickel layer 246 is, of course, not visible in this rear plan view.

FIG. 5 also shows mounting posts 230 disposed through apertures 232. Mounting posts 230 can be fixed within apertures 232 with an adhesive, a thermal weld, or any other suitable means. For example, posts 230 could each include a thread set to engage a complementary thread set of a retaining nut.

Figure 6:
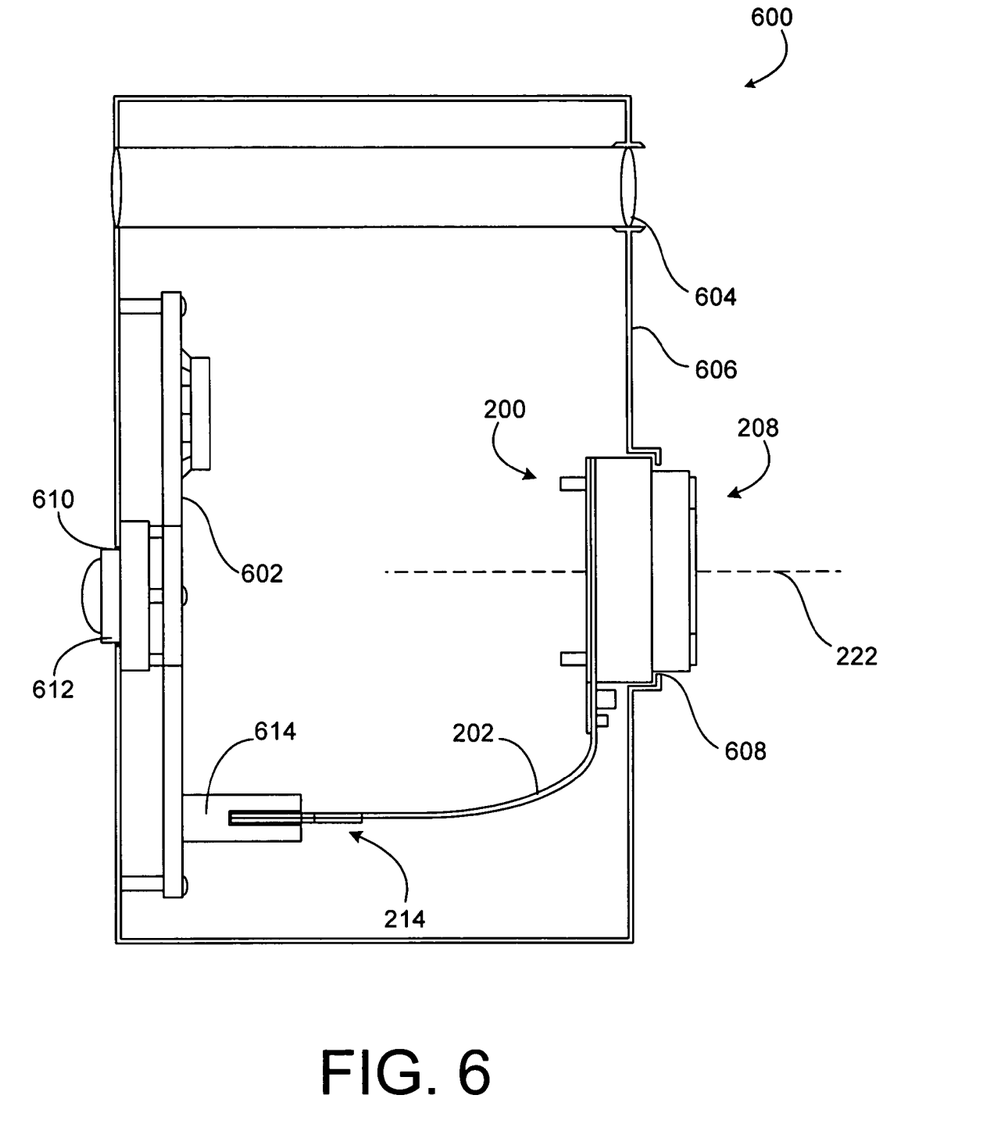
FIG. 6 is cross-sectional side view of a representational camera housing including the camera module shown in FIG. 2.

FIG. 6 is a side view of a camera 600 incorporating camera module 200. In addition to camera module 200, camera 600 includes a main host PCB 602, and a view finder 604 mounted in a camera housing 606. Camera housing 606 defines a front aperture 608, in which lens housing 208 is mounted, and a rear aperture 610 in which a user input/output (I/O) device 612 is mounted.

Main PCB 602 hosts the primary control circuitry for camera 600, as well as user I/O 612 and a female electrical connector 614 designed to accept connector 214 of camera module 200. View finder 604 is shown representationally as a simple viewing tube, because view finder designs are well known to those skilled in the art, and not particularly relevant to the present invention. Further, although user I/O is shown as a simple push button (e.g., an electronic shutter button), it should be understood that user I/O can include any other desirable I/O components, such as a keypad, a display, etc., useful in the operation of a camera.

In this particular embodiment, FPC substrate 202 is shown in a flexed position such that optical axis 222 is perpendicular to a main PCB 602. However, it is an advantage of the invention that the relative orientation between lens module 208 and main PCB 602 can be varied according to the needs of a particular application. For example, digital camera module 200 and main PCB 602 could be mounted relative to one another such that optical axis 222 would be parallel to main PCB 602. Indeed, lens module 208 can even be mounted in a portion of a housing that is movably connected to another portion of the housing in which main PCB 602 is mounted (e.g., separate sections of a flip-type mobile phone). Note also that the alignment of lens module 208 within aperture 608 is decoupled from the alignment of user I/O 612 within aperture 610.

Figure 7:
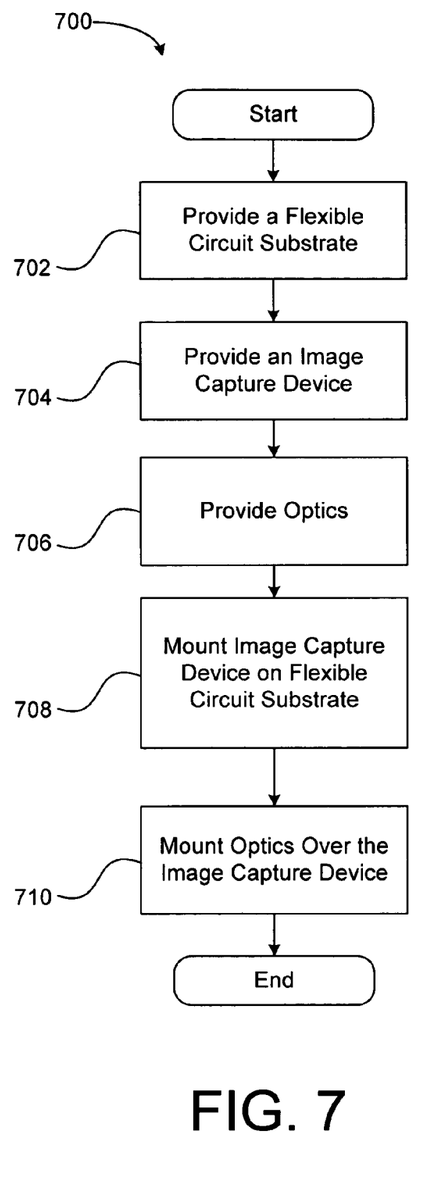
FIG. 7 is a flow chart summarizing a method for manufacturing the camera module shown in FIG. 2.

FIG. 7 is a flow chart summarizing a method 700 for manufacturing a digital camera module 200. In a first step 702, an FPC substrate is provided. Next, in a second step 704, an image capture device is provided. Then, in a third step 706, optical components are provided. Next, in a fourth step 708, the image capture device is mounted on the FPC substrate. Finally, in a fifth step 710, the optical components are mounted over the image capture device.

Figure 8:
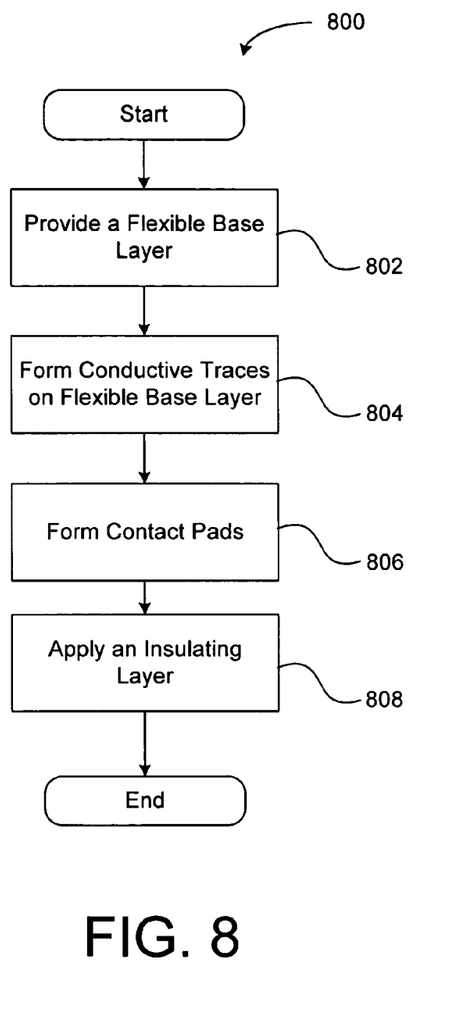
FIG. 8 is a flow chart summarizing a method for manufacturing an FPC substrate.

FIG. 8 is a flow chart summarizing one method 800 for performing first step 702 (provide an FPC substrate) of method 700. In a first step 802, a flexible base layer is provided. Next, in a second step 804, conductive traces are formed on the flexible base layer. Then, in a third step 806, contact pads are formed on the conducting traces. Finally, in a fourth step 808, an insulating layer is formed over the conducting traces and flexible base layer 238.

Figure 9:
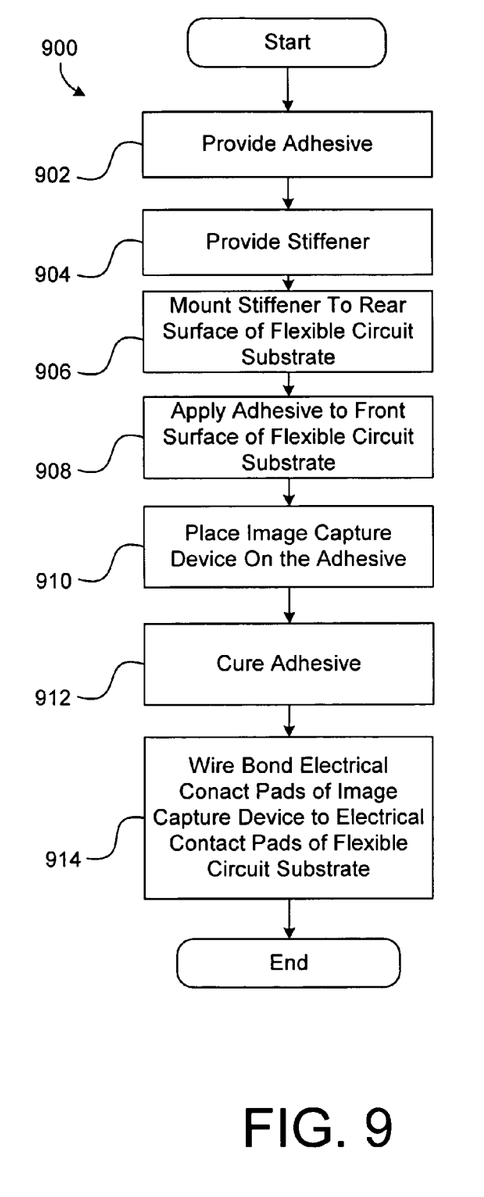
FIG. 9 is a flow chart summarizing a method for mounting an image capture device onto an FPC substrate.

FIG. 9 is a flow chart summarizing one method 900 for performing fourth step 708 (mount image capture device on FPC substrate) of method 700. In a first step 902, an adhesive is provided. Then, in a second step 904, a stiffener is provided. Next, in a third step 906, the stiffener is mounted to a rear surface of the FPC substrate. Then, in a fourth step 908, the adhesive is applied to a front surface of the FPC substrate opposite the stiffener. Next, in a fifth step 910, the image capture device is placed on the adhesive, and, in a sixth step 912, the adhesive is cured. Finally, in a seventh step 914, the die bond pads of the image capture device are wire bonded to the electrical wire bond pads of FPC substrate.

Figure 10:
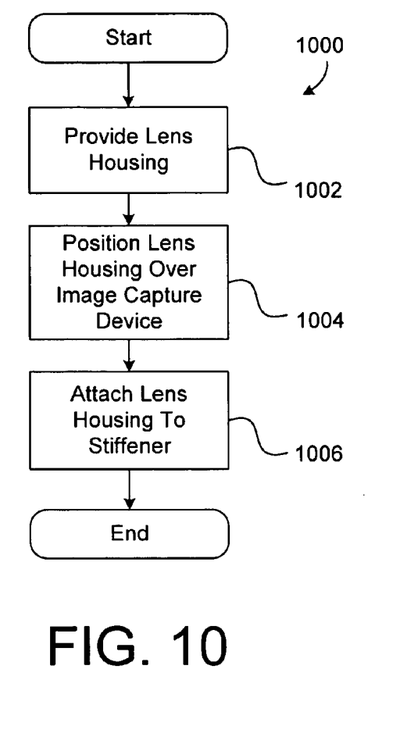
FIG. 10 is a flow chart summarizing a method for mounting a lens housing to an FPC substrate.

FIG. 10 is a flow chart summarizing one method 1000 for performing fifth step 710 (mount optics over image capture device) of method 700. In a first step 1002, a lens housing is provided. Next, in a second step 1004, the lens housing is positioned over the image capture device. Then, in a third step 1006, the lens housing is attached to the stiffener.

The description of particular embodiments of the present invention is now complete. Many of the described features may be substituted, altered or omitted without departing from the scope of the invention. For example, alternate conducting materials (e.g., copper, aluminum, etc.), may be substituted for the contact pads and the connector pads disclosed. As another example, alternate lens housings may be substituted for the representative lens housing shown. These and other deviations from the particular embodiments shown will be apparent to those skilled in the art, particularly in view of the foregoing disclosure.

We claim:

1. A digital camera module comprising:
   a flexible circuit substrate;

an image capture device mounted on said flexible substrate, said image capture device being a bare integrated circuit chip, said integrated circuit chip having a top surface including a sensor array and a bottom surface opposite said top surface, said bottom surface being directly adhered to said flexible circuit substrate; and a stiffener mounted to an opposite side of said flexible circuit substrate as said integrated circuit chip at a position under said integrated circuit chip, said stiffener including a flat surface that is mounted flush to said opposite side of said flexible circuit substrate.

2. A digital camera module according to claim 1, wherein said flexible circuit substrate comprises:
a flexible base layer; and
a conductive trace layer formed over said flexible base layer.

3. A digital camera module according to claim 2, wherein said flexible base layer comprises polyimide.

4. A digital camera module according to claim 2, wherein said flexible circuit substrate includes a plurality of contact pads electrically coupled to said conductive trace layer.

5. A digital camera module according to claim 4, wherein said contact pads comprise:
a nickel layer formed over said conductive trace layer; and
a gold surface layer formed over said nickel layer.

6. A digital camera module according to claim 4, wherein said flexible circuit substrate includes a connector electrically coupled to said trace layer.

7. A digital camera module according to claim 6, wherein said connector includes connector contact pads formed over said trace layer.

8. A digital camera module according to claim 7, wherein said connector pads comprise:
a nickel layer formed over said conductive trace layer; and
a gold surface layer formed over said nickel layer.

9. A digital camera module according to claim 6, wherein:
said flexible circuit substrate includes a first conductive trace layer on one side of said flexible base layer and a second conductive trace layer on an opposite side of said flexible base layer;
said contact pads are formed on said first conductive trace layer; and
said connector includes a plurality of connector contact pads formed on said second trace layer.

10. A digital camera module according to claim 4, wherein:
said image capture device includes contact pads formed on an integrated circuit chip; and
further comprising a direct electrical connection between said contact pads of said integrated circuit chip and said contact pads of said flexible circuit substrate.

11. A digital camera module according to claim 10, wherein said direct electrical connection is a wire bonded connection.

12. A digital camera module according to claim 4, wherein said contact pads are suitable for forming a wire bond connection thereto.

13. A digital camera module according to claim 2, further comprising an insulating layer defining contact openings formed over said trace layer.

14. A digital camera module according to claim 13, wherein said insulating layer includes soldermask.

15. A digital camera module according to claim 1, wherein said stiffener includes a glass filled epoxy resin material.

16. A digital camera module according to claim 1, wherein said flexible circuit substrate includes a plurality of contact pads electrically coupled to said conductive trace layer.

17. A digital camera module according to claim 16, wherein said contact pads comprise:
a nickel layer formed over said conductive trace layer; and
a gold surface layer formed over said nickel layer.

18. A digital camera module according to claim 1, further comprising a lens housing mounted over said image capture device.

19. A digital camera module according to claim 18, wherein said lens housing is coupled to said stiffener.

20. A digital camera module according to claim 19, wherein:
said flexible circuit substrate includes at least one mounting aperture;
said stiffener includes at least one mounting aperture; and
said lens housing includes at least one mounting post disposed through said mounting apertures of said flexible circuit substrate and said stiffener.

21. A digital camera module according to claim 1, further comprising a connector coupled to said flexible circuit substrate.

22. A digital camera module according to claim 21, wherein said connector comprises:
electrical contacts formed on a first surface of said flexible circuit substrate; and
a stiffener fixed to an opposite surface of said flexible circuit substrate.

23. A digital camera module according to claim 1, wherein said stiffener includes an electrically insulating material.

24. A digital camera module according to claim 1, wherein said stiffener is electrically-isolated from said flexible circuit substrate.

25. A method for manufacturing a camera module, comprising:
providing a flexible circuit substrate;
providing an image capture device, said image capture device being a bare integrated circuit chip, said integrated circuit chip including a top surface with light sensors and a bottom surface opposite said top surface;
mounting a stiffener to a portion of said flexible circuit substrate; and
mounting said image capture device on said flexible circuit substrate by adhering said bottom surface of said integrated circuit chip to said flexible circuit substrate on an opposite side of said flexible circuit substrate as said stiffener; and wherein
mounting said stiffener includes mounting a flat surface of said stiffener flush to said portion of said flexible circuit substrate; and
mounting said stiffener includes mounting said stiffener to said flexible circuit substrate before said integrated circuit chip is connected to said flexible circuit substrate.

26. A method for manufacturing a camera module according to claim 25, said step of providing a flexible circuit substrate includes forming conductive traces on said flexible circuit substrate.

27. A method for manufacturing a camera module according to claim 26, wherein said step of providing said flexible circuit substrate includes forming electrical contact pads on said conductive traces.

28. A method for manufacturing a camera module according to claim 27, wherein said step of forming electrical contact pads comprises:
forming a layer of nickel over contact portions of said conductive traces; and
forming a layer of gold over said layer of nickel.

29. A method for manufacturing a camera module according to claim 27, further comprising forming a connector unsaid flexible circuit substrate.

30. A method for manufacturing a camera module according to claim 29, wherein said step of forming a connector on said flexible circuit substrate includes forming connector pads over said conductive traces.

31. A method for manufacturing a camera module according to claim 30, wherein said step of forming connector pads over said conductive traces comprises:
forming a layer of nickel over contact portions of the conductive trades; and
forming a layer of gold over said layer of nickel.

32. A method for manufacturing a camera module according to claim 27, further comprising making a direct electrical connection between contact pads on an integrated circuit chip of said image capture device and said contact pads of said flexible circuit substrate.

33. A method for manufacturing a camera module according to claim 32, wherein said step of making a direct electrical connection includes wirebonding.

34. A method for manufacturing a camera module according to claim 26, wherein said step of providing said flexible circuit substrate further comprises forming an insulating layer over said conductive trace layer.

35. A method for manufacturing a camera module according to claim 34, wherein said step of forming said insulating layer includes applying soldermask over the surface of said flexible circuit substrate.

36. A method for manufacturing a camera module according to claim 25, wherein said step of mounting said stiffener includes applying an adhesive between said stiffener and said flexible circuit substrate.

37. A method for manufacturing a camera module according to claim 25, wherein said stiffener includes a rigid board material.

38. A method for manufacturing a camera module according to claim 25, wherein:
said step of providing said flexible circuit substrate further includes forming electrical traces on said flexible circuit substrate and forming electrical contact pads over contact portions of said electrical traces; and
said step of mounting said stiffener to said flexible circuit substrate includes positioning said stiffener such that at least a portion of said stiffener is disposed under said electrical contact pads.

39. A method for manufacturing a camera module according to claim 38, wherein said step of forming said contact pads on said flexible circuit substrate further comprises:
forming a layer of nickel over said contact portions of said traces; and
forming a layer of gold over said layer of nickel.

40. A method for manufacturing a camera module according to claim 25, further comprising:
providing a lens housing; and
mounting said lens housing to said flexible circuit substrate over said image capture device.

41. A method for manufacturing a camera module according to claim 40, wherein said step of mounting said lens housing to said flexible circuit substrate comprises attaching said lens housing to said stiffener.

42. A method for manufacturing a camera module according to claim 41, wherein said step of attaching said lens housing to said stiffener includes inserting a plurality of mounting posts formed on one of said lens housing and said stiffener through a complementary plurality of apertures formed in the other of said lens housing and said stiffener.

43. A method for manufacturing a camera module according to claim 41, wherein:
said flexible circuit substrate includes at least one alignment feature for aligning the optical axis of said lens housing with the optical axis of said image capture device; and
said step of mounting said lens housing includes engaging said alignment feature with said lens housing.

44. A method for manufacturing a camera module according to claim 25, further comprising forming a connector on the flexible circuit substrate.

45. A method for manufacturing a camera module according to claim 44, wherein said step of forming a connector comprises:
forming electrical contacts on a surface said flexible circuit substrate; and
applying a second stiffener to a second surface of said flexible circuit substrate opposite said electrical contacts.

46. A method for manufacturing a camera module according to claim 25, wherein said stiffener is electrically-isolated from said flexible circuit substrate.

47. A camera module comprising:
a flexible circuit substrate;
an image capture device, said image capture device being a bare integrated circuit chip having a top surface and a bottom surface, said top surface including a sensor array, said bottom surface being opposite said top surface;
means for directly mounting said bottom surface of said image capture device to a surface of said flexible circuit substrate; and
a stiffener positioned under said image capture device on an opposite side of said flexible circuit substrate, said stiffener including a flat surface that is mounted flush to said opposite side of said flexible circuit substrate.

48. A camera module according to claim 47, further comprising means for electrically connecting said image capture device to said flexible circuit substrate.

49. A camera module according to claim 47, wherein said stiffener is electrically-isolated from said flexible circuit substrate.

50. A camera comprising:
a body;
a flexible circuit substrate contained within said body, said flexible circuit substrate having a first surface and a second surface;
an image capture device mounted on said flexible circuit substrate, said image capture device being a bare die having a top surface and a bottom surface, said top surface including a sensor array, said bottom surface being opposite said top surface and being directly adhered to said first surface of said flexible circuit substrate;
a stiffener positioned under said image capture device on an opposite side of said flexible circuit substrate; and
a lens holder mounted on said first surface of said flexible circuit substrate; and wherein
said stiffener includes a flat surface that is mounted flush to said opposite side of said flexible circuit substrate.

51. A camera according to claim 50, wherein said stiffener is electrically-isolated from said flexible circuit substrate.

* * * * *